United States Patent
Kang et al.

(10) Patent No.: US 9,830,972 B2
(45) Date of Patent: Nov. 28, 2017

(54) SEMICONDUCTOR DEVICE AND SEMICONDUCTOR SYSTEM

(71) Applicant: Samsung Electronics Co., Ltd., Suwon-si, Gyeonggi-do (KR)

(72) Inventors: Suk Yong Kang, Suwon-si (KR); Han-Gi Jung, Hwaseong-si (KR); Hun-Dae Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/969,113

(22) Filed: Dec. 15, 2015

(65) Prior Publication Data
US 2016/0196865 A1   Jul. 7, 2016

(30) Foreign Application Priority Data
Jan. 5, 2015   (KR) .................. 10-2015-0000545

(51) Int. Cl.
*G11C 7/10* (2006.01)
*G11C 11/4093* (2006.01)

(52) U.S. Cl.
CPC ........ *G11C 11/4093* (2013.01); *G11C 7/1084* (2013.01); *G11C 7/1093* (2013.01)

(58) Field of Classification Search
CPC .................. G11C 11/4093; G11C 11/4076
See application file for complete search history.

(56) References Cited

U.S. PATENT DOCUMENTS

| | | | |
|---|---|---|---|
| 5,978,281 A * | 11/1999 | Anand | G11C 7/1039 365/189.05 |
| 6,433,600 B2 | 8/2002 | Ilkbahar | |
| 7,102,937 B2 | 9/2006 | Mukherjee et al. | |
| 7,460,417 B2 | 12/2008 | Kim et al. | |
| 7,715,253 B2 | 5/2010 | Kim et al. | |
| 7,889,580 B2 | 2/2011 | Millar et al. | |
| 7,990,781 B1 | 8/2011 | Venkataraman et al. | |
| 8,086,813 B2 | 12/2011 | Gillingham et al. | |
| 8,743,635 B2 | 6/2014 | Kizer et al. | |
| 8,817,555 B2 | 8/2014 | Ok | |
| 2013/0265826 A1* | 10/2013 | Lee | G11C 16/10 365/185.17 |
| 2014/0258607 A1 | 9/2014 | Shim et al. | |

FOREIGN PATENT DOCUMENTS

KR   20090100540 A   9/2009

* cited by examiner

*Primary Examiner* — Pho M Luu
*Assistant Examiner* — Mohammed A Bashar
(74) *Attorney, Agent, or Firm* — Harness, Dickey & Pierce, P.L.C.

(57) ABSTRACT

Provided is a semiconductor device comprising a signal generator that generates a differential data strobe signal, and a converter that extends a length of a postamble section of the differential data strobe signal from a first length to a second length, wherein the differential data strobe signal enters a high impedance state after the postamble section.

18 Claims, 12 Drawing Sheets

1200

1300

1400

SEMICONDUCTOR DEVICE AND SEMICONDUCTOR SYSTEM

CROSS-REFERENCE TO RELATED APPLICATION

This application claims priority from Korean Patent Application No. 10-2015-0000545 filed on Jan. 5, 2015 in the Korean Intellectual Property Office, and all the benefits accruing therefrom under 35 U.S.C. 119, the contents of which in its entirety are herein incorporated by reference.

BACKGROUND

1. Technical Field

The present inventive concepts relate to a semiconductor device and a semiconductor system.

2. Description of the Related Art

Data strobe signal is a signal for reading data signal at periodic intervals. In other words, data strobe signal can be considered to notify the timing when data is input to a storage device or a circuit. A high impedance section of such a data strobe signal can become unstable depending on data path of the memory and the channel environment, which may cause a glitch.

If the data strobe signal including the glitch decreases the last data window margin at a first deserialization stage of DRAM, it decreases the timing margin at the next deserialization stage, which may lead to a limit of high speed operation.

SUMMARY

According to an aspect of the present inventive concepts, there is provided a semiconductor device comprising a signal generator that generates a differential data strobe signal, and a converter that extends a length of a postamble section of the differential data strobe signal from a first length to a second length, wherein the differential data strobe signal enters a high impedance state after the postamble section.

According to another aspect of the present inventive concepts, there is provided a semiconductor device comprising, a signal generator that generates a differential data strobe signal, and a converter that converts a postamble section of the differential data strobe signal into a section including an edge, wherein the differential data strobe signal includes pulses that are consecutively repeated between a preamble section and the postamble section, and a length of the postamble section converted by the converter may be longer than a half cycle of the pulses.

According to still another aspect of the present inventive concepts, there is provided a semiconductor system comprising a memory controller that generates a differential data strobe signal, wherein a length of a postamble section of the generated differential data strobe signal is extended from a first length to a second length, and a memory that is provided with the differential data strobe signal having the postamble section which has the second length, and synchronizes data with the provided differential data strobe signal, and the memory controller provides the data for the memory.

BRIEF DESCRIPTION OF THE DRAWINGS

The above and other features and advantages of the present inventive concepts will become more apparent by describing in detail example embodiments thereof with reference to the attached drawings in which.

DETAILED DESCRIPTION OF EXAMPLE EMBODIMENTS

Figure 1:
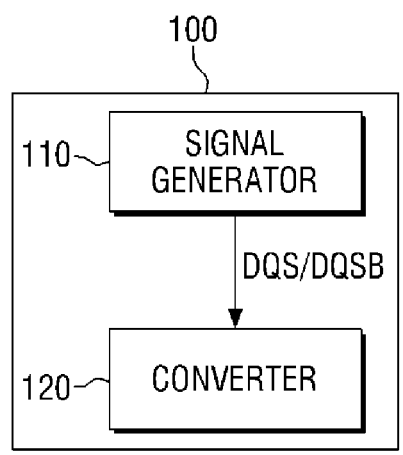
FIG. 1 is a block diagram illustrating a semiconductor device according to an example embodiment of the present inventive concepts.

Advantages and features of the present inventive concepts and methods of accomplishing the same may be understood more readily by reference to the following detailed description of example embodiments and the accompanying drawings. The present inventive concepts may, however, be embodied in many different forms and should not be construed as being limited to the example embodiments set forth herein. Rather, these example embodiments are provided so that this disclosure will be thorough and complete and will fully convey the concept of the inventive concepts to those skilled in the art, and the present inventive concepts will only be defined by the appended claims. Like reference numerals refer to like elements throughout the specification.

The terminology used herein is for the purpose of describing particular example embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising, " when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, these example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The semiconductor device according to an example embodiment of the present inventive concepts will be described below with reference to FIGS. 1 to 5.

Figure 2:
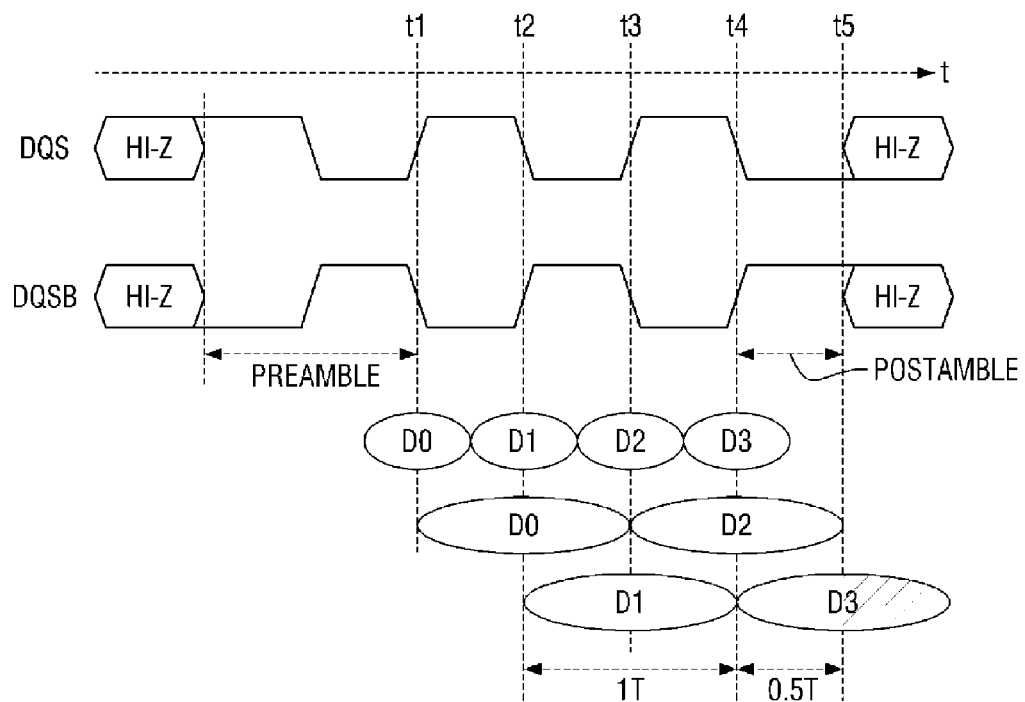
FIG. 2 is a schematic diagram illustrating a differential data strobe signal before being converted by a converter of FIG. 1.
Figure 3:
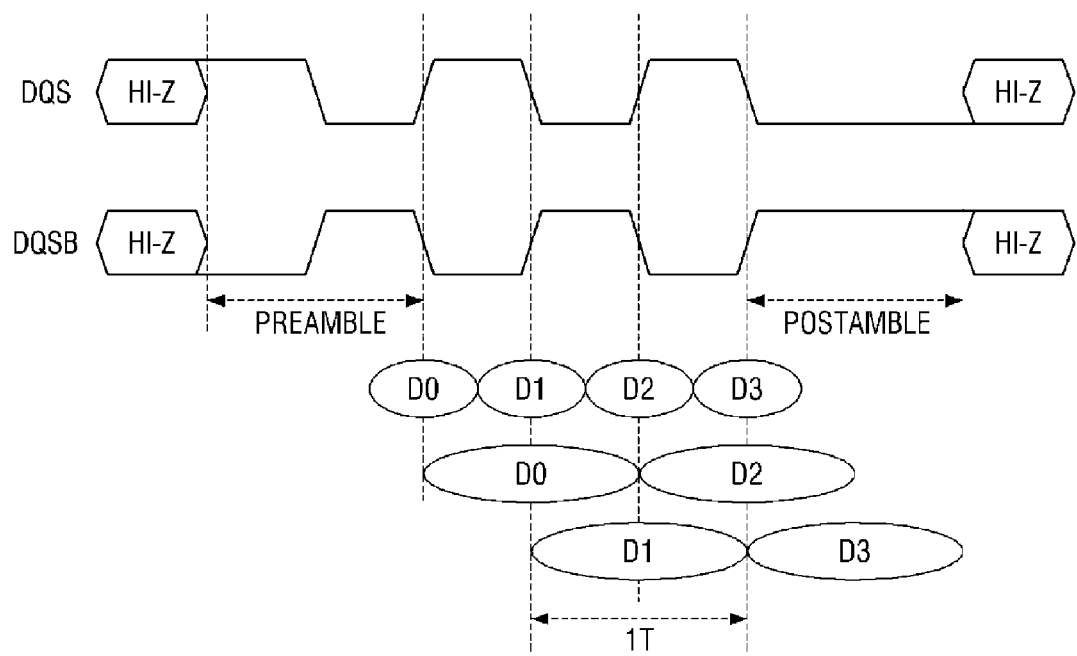
FIG. 3 is a schematic diagram illustrating an example embodiment of a differential data strobe signal converted by the converter of FIG. 1.
Figure 4:
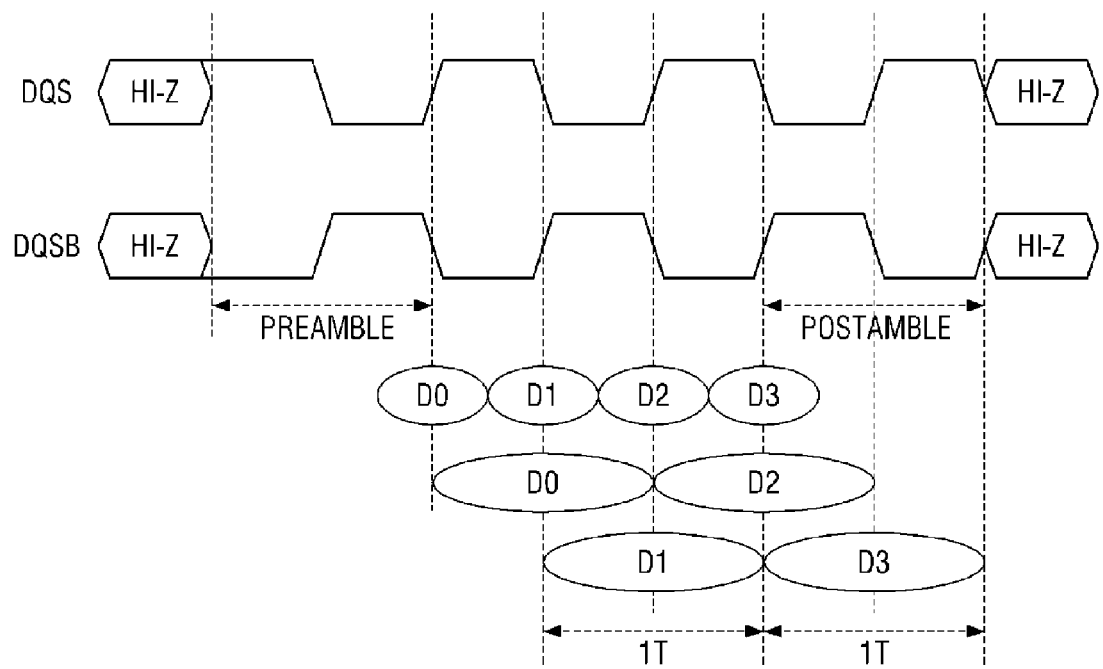
FIG. 4 is a schematic diagram illustrating another example embodiment of the differential data strobe signal converted by the converter of FIG. 1.
Figure 5:
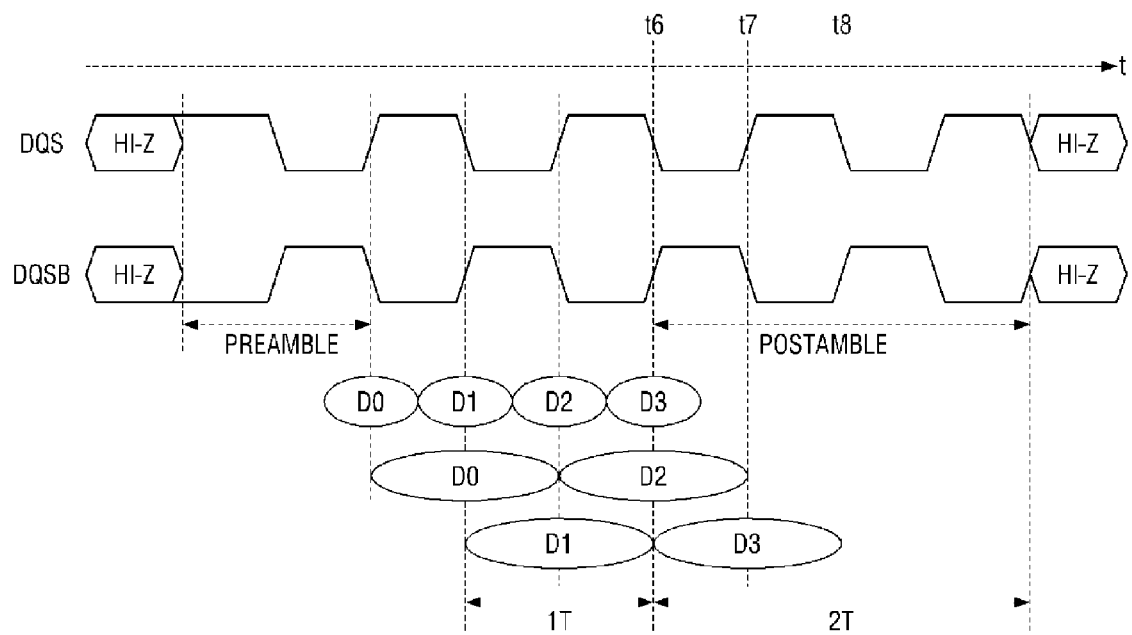
FIG. 5 is a schematic diagram illustrating still another example embodiment of the differential data strobe signal converted by the converter of FIG. 1.

FIG. 1 is a block diagram illustrating the semiconductor device according to an example embodiment of the present inventive concepts. FIG. 2 is a schematic diagram illustrating a differential data strobe signal before being converted by the converter of FIG. 1. FIG. 3 is a schematic diagram illustrating an example embodiment of the differential data strobe signal converted by the converter of FIG. 1. FIG. 4 is a schematic diagram illustrating another example embodiment of the differential data strobe signal converted by the converter of FIG. 1. FIG. 5 is a schematic diagram illustrating still another example embodiment of the differential data strobe signal converted by the converter of FIG. 1.

Referring to FIG. 1, a semiconductor device 100 according to an example embodiment of the present inventive concepts can include a signal generator 110 and a converter 120.

The signal generator 110 may generate a differential data strobe signal (DQS/DQSB).

Specifically, the differential data strobe signal (DQS/DQSB) can include a data strobe signal (DQS) and a complement (DQSB) of the data strobe signal.

As can be seen with reference to FIG. 2, it can be understood that the complement (DQSB) of the data strobe signal is completely opposite to the data strobe signal (DQS). That is, when the data strobe signal (DQS) is at a high level, the complement (DQSB) of the data strobe signal is at a low level, and when the data strobe signal (DQS) is at a low level, the complement (DQSB) of the data strobe signal is at a high level.

Such a differential data strobe signal (DQS/DQSB) is a signal in the form of consecutive pulses, and each pulse can be generated with a constant cycle.

More specific description of the differential data strobe signal (DQS/DQSB) will be provided below.

The converter 120 is to extend the length of the postamble section of the differential data strobe signal (DQS/DQSB).

Specifically, the converter 120 may be provided with the differential data strobe signal (DQS/DQSB) from the signal generator 110, and extend the length of the postamble section of the provided differential data strobe signal (DQS/DQSB) from a first length to a second length.

Here, the first length is equal to a half cycle (i.e., 0.5 T of FIG. 2) of each of the consecutive pulses of the differential data strobe signal (DQS/DQSB), and the second length can be longer than a half cycle of each of the consecutive pulses of the differential data strobe signal (DQS/DQSB). This will be described in detail below.

Referring to FIG. 2, the differential data strobe signal (DQS/DQSB) before being converted by the converter (120 of FIG. 1) of FIG. 1 is illustrated.

As described above, the differential data strobe signal (DQS/DQSB) may include the data strobe signal (DQS) and the complement (DQSB) of the data strobe signal. Here, the phases of the data strobe signal (DQS) and the complement (DQSB) of the data strobe signal are opposite to each other.

The data strobe signal (DQS) may include a high impedance state (HI-Z), a preamble section (PREAMBLE), a postamble section (POSTAMBLE), and consecutively repeated pulses between the preamble section (PREAMBLE) and the postamble section (POSTAMBLE).

During idle state, the data strobe signal (DQS) stays at high impedance state (HI-Z), and the data strobe signal (DQS) is shifted to the low level before outputting valid data and notifies an external device (not shown) that valid data will be output so that the external device is able to receive the data correctly. Thereafter, the data strobe signal (DQS) repeatedly toggles the high and low levels, and data is output aligned with the toggles of the data strobe signal (DQS).

The data strobe signal (DQS) stays at a low level during last half clock (i.e., 0.5 T) of data output, which notifies the external device that the data output is completed. Thereafter, the data strobe signal (DQS) enters into high impedance state (Hi-Z) again. A section staying at a low level before output of valid data is called a preamble section (PREAMBLE), and a section staying at a low level during last half clock of valid data output is called a postamble section (POSTAMBLE) (i.e., the postamble section (POSTAMBLE) is a section that appears later than the preamble section (PREAMBLE)).

In other words, the data strobe signal (DQS) notifies the data output start timing and the data output end timing to the external device by utilizing the preamble section (PREAMBLE) and the postamble section (POSTAMBLE), and the external device determines the exact timing for receiving the data, by utilizing the preamble section (PREAMBLE) of the data strobe signal (DQS) that is applied earlier than the data.

Here, the high impedance state (HI-Z) may be a floating (floating) state, i.e., an unstable state and may be subject to glitch. Also, the preamble section (PREAMBLE) may have a length of one clock (i.e., 1 T).

In the case of four bit data length (D0 to D3), the data strobe signal (DQS) is shifted to a low level and stays at a low level during the preamble section (PREAMBLE), and is toggled to a high level and a low level in synchronization with the output of the first to third data (D0 to D2), and stays at a low level during the postamble section in synchronization with the last data, that is, the fourth data (D3).

Here, the data strobe signal (DQS) can be toggled to a high level for the first data (D0), can be toggled to a low level for the second data (D1), and can be toggled to a high level for the third data (D2).

When the data strobe signal (DQS) synchronizes each of four data (D0 to D3) at the rising edges (i.e., the times t1, t3) or the falling edges (i.e., the times t2, t4), each data (DO to D3) lasts for half cycle (1 T), the first data (D0) can be synchronized with the rising edge of the data strobe signal (DQS) at the time t1, and the third data (D2) can be synchronized with the rising edge of the data strobe signal (DQS) at the time t3 subsequently to the first data (D2). Furthermore, the second data (D1) can be synchronized with the falling edge of the data strobe signal (DQS) at the time t2, and the fourth data (D3) can be synchronized with the falling edge of the data strobe signal (DQS) at the time t4 subsequently to the second data (D1).

Here, a part of the fourth data (D3) can overlap a high impedance state (HI-Z) in which a glitch may occur. And in order to resolve such an overlapping problem, the data window margin of the fourth data (D3) can decrease. When the data window margin decreases, this leads to a decrease in the timing margin later, which may causes the problem of high-speed limit.

Referring to FIGS. 1 and 3, in order to solve the problem present in FIG. 2, the converter 120 can extend the postamble section (POSTAMBLE) of the differential data strobe signal (DQS/DQSB).

Specifically, the converter 120 can extend the length of the postamble section (POSTAMBLE) of the differential data strobe signal (DQS/DQSB) from the first length to the second length.

Here, the first length is a length (i.e., 0.5 T) of the postamble section (POSTAMBLE) illustrated in FIG. 2, and the second length can be longer than the first length. That is, the second length can be longer than half of the clock period (i.e., 0.5 T).

Specifically, for example, the second length can be n times (n is an integer of 1 or more) each cycle (i.e., 1 T) of consecutive pulses of the differential data strobe signal (DQS/DQSB), that is, n times 1 clock (1 T). In this case, the data strobe signal (DQS) and the complement (DQSB) of the data strobe signal can include the pulses that are repeated n times during second length.

In the present inventive concepts, examples of the second length described above are only an example, and the present inventive concepts are not limited thereto.

In addition, the differential data strobe signal (DQS/DQSB) can keep the same level (that is, a low level in the case of the data strobe signal (DQS), and a high level in the case of the complement (DQSB) of the data strobe signal) during second length.

By extending the postamble section (POSTAMBLE) of the differential data strobe signal (DQS/DQSB) through the converter 120, it is possible to reduce or prevent a part of the fourth data (D3) from overlapping the impedance state (HI-Z) in which a glitch may occur. Accordingly, it is possible to reduce or prevent a decrease in data window margin of the fourth data (D3), and the limit of high speed operation can also be reduced or prevented.

Referring to FIGS. 1 and 4, to solve the problems explained in FIG. 2, the converter 120 is configured to extend the postamble section (POSTAMBLE) of the differential data strobe signal (DQS/DQSB).

Specifically, the converter 120 may extend the length of the postamble section (POSTAMBLE) of the differential data strobe signal (DQS/DQSB) from the first length to the second length, and the extended postamble section (POSTAMBLE) may include edges.

Here, the first length is a length (i.e., 0.5 T) of the postamble section (POSTAMBLE) illustrated in FIG. 2, and the second length can be longer than the first length. That is, the second length can be longer than the ½ clock (i.e., 0.5 T).

For example, the second length can be same as each cycle of consecutive pulses of the differential data strobe signal (DQS/DQSB), that is, 1 clock (1 T). The data strobe signal (DQS) and the complement (DQSB) of the data strobe signal may be configured to include one pulse during second length.

Additionally, unlike FIG. 3, the differential data strobe signal (DQS/DQSB) can change from a first level to a second level different from the first level around the edge during second length. In other words, the data strobe signal (DQS) may be shifted from a low level to a high level around the rising edge, and the complement (DQSB) of the data strobe signal can change from a high level to a low level around the falling edge.

As a result, since the converter 120 converts and extends the postamble section (POSTAMBLE) of the differential data strobe signal (DQS/DQSB) into a section having edges, it is possible to reduce or prevent a part of the fourth data (D3) from overlapping with the high impedance state (HI-Z) in which the glitch may occur. Accordingly, it is possible to reduce or prevent a decrease in data window margin of the fourth data (D3), and the limit of high speed operation can also be reduced or prevented.

Referring to FIGS. 1 and 5, to solve the problems explained in FIG. 2, the converter 120 may extend the postamble section (POSTAMBLE) of the differential data strobe signal (DQS/DQSB).

Specifically, the converter 120 may extend the length of the postamble section (POSTAMBLE) of the differential data strobe signal (DQS/DQSB) from the first length to the second length, and the extended postamble section (POSTAMBLE) can include multi-edges.

Here, the first length is a length (i.e., 0.5 T) of the postamble section (POSTAMBLE) illustrated in FIG. 2, and the second length can be longer than the first length. That is, the second length can be longer than ½ clock (i.e., 0.5 T).

Specifically, for example, the second length can be m times (m is an integer of 2 or more) each cycle of consecutive pulses of the differential data strobe signal (DQS/DQSB), that is, m times 1 clock (1 T). In this case, the data strobe signal (DQS) and the complement (DQSB) of the data strobe signal can include pulses that are repeated m times during second length.

Additionally, unlike FIG. 4, the differential data strobe signal (DQS/DQSB) can have multi-edges during second length. Therefore, the differential data strobe signal (DQS/DQSB) may be shifted from a first level to a second level at time t6, may be shifted from a second level to a first level at time t7, and may be shifted from a first level to a second level at time t8.

That is, in the case of the data strobe signal (DQS), it may be shifted from a low level to a high level around the rising edge at time t6, may be shifted from a high level to a low level around the falling edge at time t7, and may be shifted from a low level to a high level around the rising edge at time t8.

Also, the complement (DQSB) of the data strobe signal may be shifted from a high level to a low level around the falling edge at time t6, may be shifted from a low level to a high level around the rising edge at time t7, and may be shifted from a high level to a low level around the falling edge at time t8.

As a result, since the converter 120 converts and extends the postamble section (POSTAMBLE) of the differential data strobe signal (DQS/DQSB) into a section having a multi-edge, it is possible to reduce or prevent a part of the fourth data (D3) from overlapping the high impedance state (HI-Z) in which the glitch may occur. In particular, since the postamble section (POSTAMBLE) of the differential data strobe signal (DQS/DQSB) illustrated in FIG. 5 can have a length of 2 T or more that is longer than the length (i.e., 1 T) of the fourth data (D3), it can be said that the possibility of the fourth data (D3) overlapping with the high impedance state (HI-Z) is lower than the case of FIG. 4.

As a result, it is possible to reduce or prevent a decrease in data window margin of the fourth data (D3), and the limit of high speed operation can also be reduced or prevented.

Hereinafter, a semiconductor system according to an example embodiment of the present inventive concepts will be described with reference to FIGS. 6 to 8.

Figure 6:
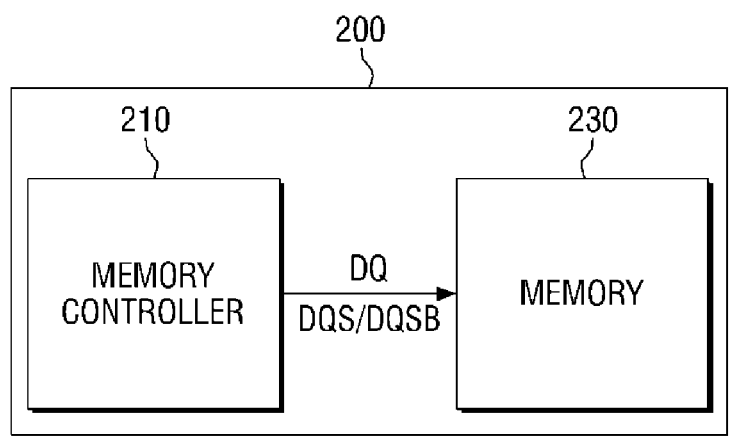
FIG. 6 is a block diagram illustrating a semiconductor system according to an example embodiment of the present inventive concepts.

FIG. 6 is a block diagram illustrating a semiconductor system according to an example embodiment of the present inventive concepts. FIG. 7 is a schematic diagram illustrating the memory controller of FIG. 6. FIG. 8 is a schematic diagram illustrating the memory of FIG. 6.

Referring to FIG. 6, a semiconductor system 200 according to an example embodiment of the present inventive concepts can include a memory controller 210 and a memory 230.

The memory controller 210 is able to generate the differential data strobe signal (DQS/DQSB) and extend the length of the postamble section of the generated differential data strobe signal (DQS/DQSB) from a first length to a second length.

Specifically, the memory controller 210 is able to generate the differential data strobe signal (DQS/DQSB), extend the length of the postamble section of the generated differential data strobe signal (DQS/DQSB) from a first length to a second length, and provide the memory 230 with the differential data strobe signal (DQS/DQSB) having the extended length of the postamble section.

The memory controller 210 can provide the data (DQ) for the memory 230. Here, the data (DQ) may be provided to the memory 230 in the form of TTL (Transistor Transistor Logic) signal, but is not limited thereto.

Figure 7:
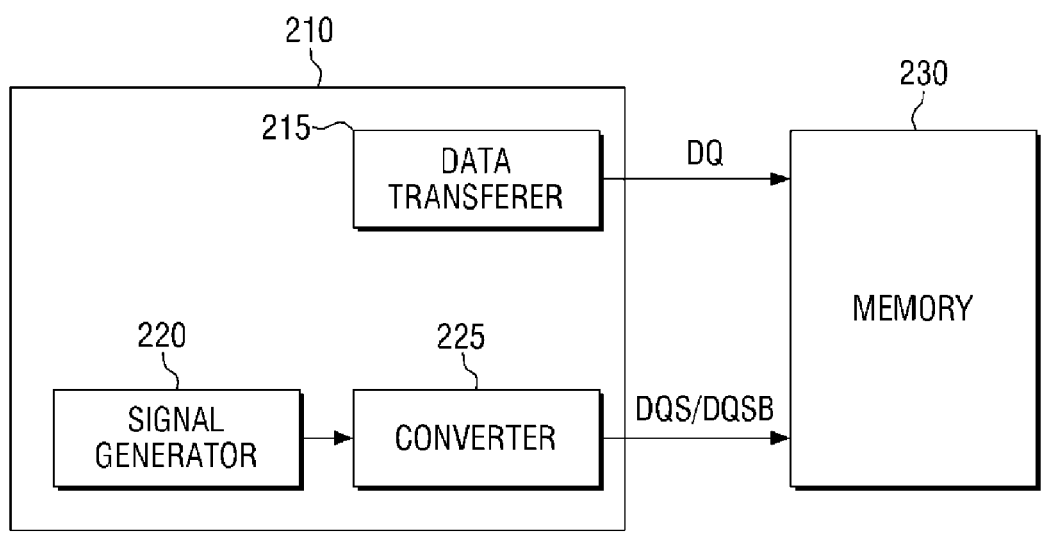
FIG. 7 is a schematic diagram illustrating a memory controller of FIG. 6.

More specific descriptions of the memory controller 210 will be provided in FIG. 7.

The memory 230 is provided with the differential data strobe signal (DQS/DQSB) having the postamble section extended to the second length, and synchronizes the data (DQ), by utilizing the provided differential data strobe signal (DQS/DQSB).

Specifically, the memory 230 receives the data (DQ) and the differential data strobe signal (DQS/DQSB) from the memory controller 210, and synchronizes the data (DQ) by utilizing the provided differential data strobe signal (DQS/DQSB).

Although the memory 230 may be, for example, a DRAM, it is not limited thereto.

Figure 8:
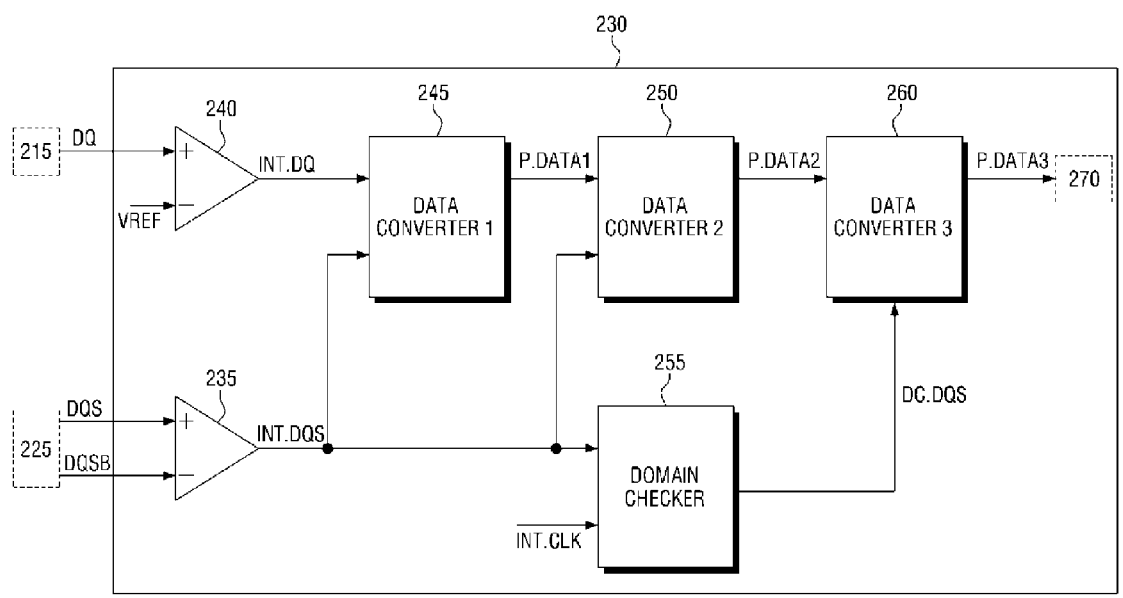
FIG. 8 is a schematic diagram illustrating the memory of FIG. 6.

More specific descriptions of the memory 230 will be provided in FIG. 8.

Referring to FIG. 7, the memory controller 210 can include a data transferer 215, a signal generator 220, and a converter 225.

The data transfer circuit 215 is able to provide the data (DQ) for the memory 230.

Specifically, the data transfer circuit 215 is able to provide a second buffer (240 in FIG. 8) of the memory 230 with the data (DQ) in the form of TTL signal.

The signal generator 220 is able to generate the differential data strobe signal (DQS/DQSB).

Specifically, the signal generator 220 is able to generate the differential data strobe signal (DQS/DQSB) and provide it for the converter 225.

The converter 225 is able to extend the length of the postamble section of the differential data strobe signal (DQS/DQSB) from a first length to a second length.

Specifically, the converter 225 is able to extend the length of the postamble section of the differential data strobe signal (DQS/DQSB) provided from the signal generator 220, and provide the memory 230, i.e., the first buffer (235 in FIG. 8) with the differential data strobe signal (DQS/DQSB) having the extended postamble section.

Additionally, concepts of the first length and the second length correspond to those of the first length and the second length described above in FIGS. 3 to 5, and the specific descriptions thereof will not be provided.

Referring to FIG. 8, the memory 230 can include a first buffer 235, a second buffer 240, a first data converter 245, a second data converter 250, a domain checker 255 and a third data converter 260.

The first buffer 235 is able to convert the differential data strobe signal (DQS/DQSB) provided from the memory controller 210 into an internal data strobe signal (INT.DQS).

Specifically, the first buffer 235 is able to convert the differential data strobe signal (DQS/DQSB) provided from the converter 225, i.e., the differential data strobe signal (DQS/DQSB) having the extended postamble section, into the internal data strobe signal (INT.DQS).

In FIG. 8, it is shown that the data strobe signal (DQS) of the differential data strobe signal (DQS/DQSB) is provided to a positive terminal (+) of the first buffer 235, and the complement (DQSB) of the data strobe signal is provided to a negative terminal (−) of the first buffer 235, in which the phase is checked.

The first buffer 235 is able to provide the internal data strobe signal (INT.DQS) for the first data converter 245, the second data converter 250, and the domain checker 255.

The second buffer 240 is able to convert the data (DQ), which is provided from the memory controller 210, into the CMOS level.

Specifically, the second buffer 240 is able to convert the data (DQ), which is provided from the data transfer circuit 215, into the CMOS level. That is, the second buffer 240 is able to convert the data (DQ), which is provided in the form of TTL signal, into the CMOS level.

In FIG. 8, it is shown that the data (DQ) is provided to the positive terminal (+) of the second buffer 240 and the reference voltage (VREF) is provided to the negative terminal (−) of the second buffer 240, in which the phase is checked.

Furthermore, the second buffer 240 is able to provide the first data converter 245 with the data (INT.DQ) converted into the CMOS level.

The first data converter 245 is able to convert the data (INT.DQ), which is converted into the CMOS level, into a first parallel data (P.DATA1) in synchronization with the internal data strobe signal (INT.DQS).

Specifically, the first data converter 245 is able to convert the data (INT.DQ), which is provided from the second buffer 240 and converted into the CMO level, into a first parallel data (P.DATA1) in synchronization with the internal data strobe signal (INT.DQS) provided from the first buffer 235.

Here, the first parallel data (P.DATA1) can include 2 p (p is an integer of 1 or more) parallel data, and more specifically, the first parallel data (P.DATA1) can include two parallel data.

Also, the first data converter 245 is able to provide the first parallel data (P.DATA1) for the second data converter 250.

The second data converter 250 is able to convert the first parallel data (P.DATA1) into a second parallel data (P.DATA2) in synchronization with the internal data strobe signal (INT.DQS).

Specifically, the second data converter 250 is able to convert the first parallel data (P.DATA1) provided from the first data converter 245 into the second parallel data (P.DATA2), in synchronization with the internal data strobe signal (INT.DQS) provided from the first buffer 235.

Here, the second parallel data (P.DATA2) can include 8 p (p is an integer of 1 or more) parallel data, and more specifically, the second parallel data (P.DATA2) can include the eight parallel data.

Furthermore, the second data converter 250 is able to provide the second parallel data (P.DATA2) for the third data converter 260.

The domain checker 255 is able to check the phase between the internal data strobe signal (INT.DQS) and the internal clock signal (INT.CLK).

Specifically, the domain checker 255 is able to check the phase, i.e., the domain between the internal data strobe signal (INT.DQS) provided from the first buffer 235 and the internal clock signal (INT.CLK). Here, the internal clock signal (INT.CLK) is a signal that is internally generated by the memory 230 and provided to the domain checker 255, and although it not shown in the drawings, the memory 230 can further include an internal clock generator (not shown) that generates the internal clock signal (INT.CLK).

The internal clock generator (not shown) is able to provide the internal clock signal (INT.CLK) for the domain checker 255, for example, by utilizing a PLL (Phase Locked Loop) or a DLL (Delay Locked Loop), but it is not limited thereto.

In addition, the domain checker 255 is able to provide the third data converter 260 with the internal data strobe signal (DC.DQS) in which the phase is checked.

The third data converter 260 is able to convert the second parallel data (P.DATA2) into the third parallel data (P.DATA3) in synchronization with the internal data strobe signal (DC.DQS) in which the phase is checked.

Specifically, the third data converter 260 is able to convert the second parallel data (P.DATA2) provided from the second data converter 250 into the third parallel data (P.DATA3), in synchronization with the internal data strobe signal (DC.DQS) which is provided from the domain checker 255 and in which the phase is checked.

Here, the third parallel data (P.DATA3) can include 16 p (p is an integer of 1 or more) parallel data, and more specifically, the third parallel data (P.DATA3) can include 16 parallel data.

The third data converter 260 is able to provide the third parallel data (P.DATA3) for a particular region in the memory 230 (for example, a core region or a peripheral region) 270.

As a result, by extending the postamble section of the differential data strobe signal (DQS/DQSB) through the converter 225 of the memory controller 210 (i.e., by extending the length of the postamble section, or by converting it into a section having an edge, or by converting it into a section having a multi-edge), it is possible to reduce or prevent a part of the last data, which is provided to the memory 230 from the memory controller 210, from overlapping a high impedance state in which glitch occurs. Accordingly, it is possible to reduce or prevent a decrease in data window margin of the last data, and the problem of high-speed limit due to a further decrease in timing margin can also be reduced or prevented.

Figure 9:
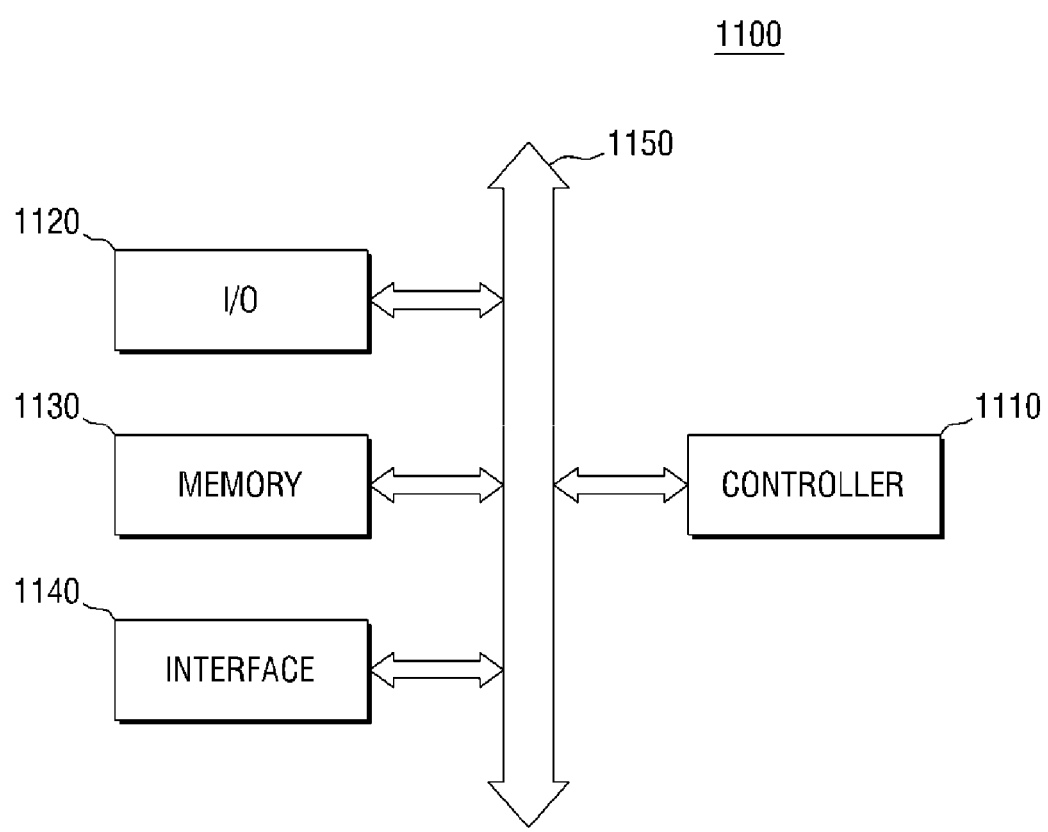
FIG. 9 is a block diagram of an electronic system including the semiconductor device according to some example embodiments of the present inventive concepts.

FIG. 9 is a block diagram of an electronic system including the semiconductor device according to some example embodiments of the present inventive concepts.

Referring to FIG. 9, an electronic system 1100 according to an example embodiment of the present inventive concepts can include a controller 1110, an input-output device (1120, I/O), a memory device 1130, an interface 1140 and a bus 1150. The controller 1110, the input-output device 1120, the memory device 1130 and/or the interface 1140 can be coupled together via the bus 1150. The bus 1150 corresponds to a path through which the data are moved.

The controller 1110 can include at least one of a microprocessor, a digital signal process, a microcontroller and logic elements capable of performing the functions similar to these elements. The input-output device 1120 can include a keypad, a keyboard, a display device or the like. The memory device 1130 is able to store data and/or instruction words. The interface 1140 is able to perform a function of transmitting the data to the communication network or receiving the data from the communication network. The interface 1140 can have a wired or wireless form. For example, the interface 1140 can include an antenna or a wired and wireless transceiver. Although not shown, the electronic system 1100 can further include a high-speed DRAM and/or SRAM or the like, as an operation memory for improving the operation of the controller 1110. The semiconductor device 100 according to some example embodiments of the present inventive concepts can be provided inside the memory device 1130 or can be provided as a part of the controller 1110, the input-output device (1120, I/O) or the like.

The electronic Systems 1100 can be applied to a PDA (Personal Digital Assistants), a portable computer, a web tablet, a wireless phone, a mobile phone, a digital music player, a memory card, or all electronic products capable of transmitting and/or receiving information in a wireless environment.

Figure 10:
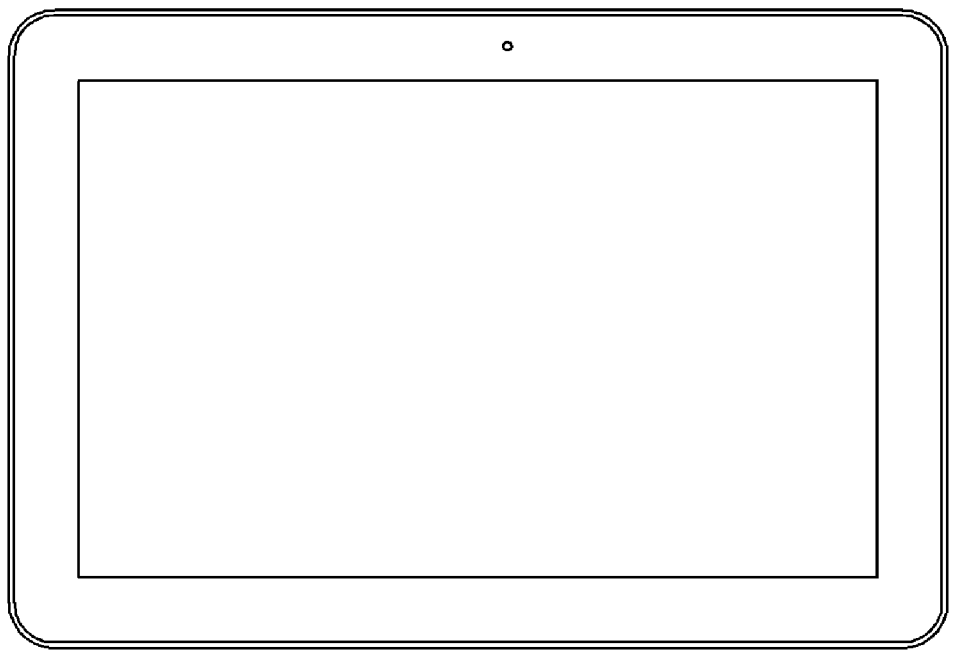
FIGS. 10 to 12 are example electronic systems to which the semiconductor device according to some example embodiments of the present inventive concepts can be applied.
Figure 11:
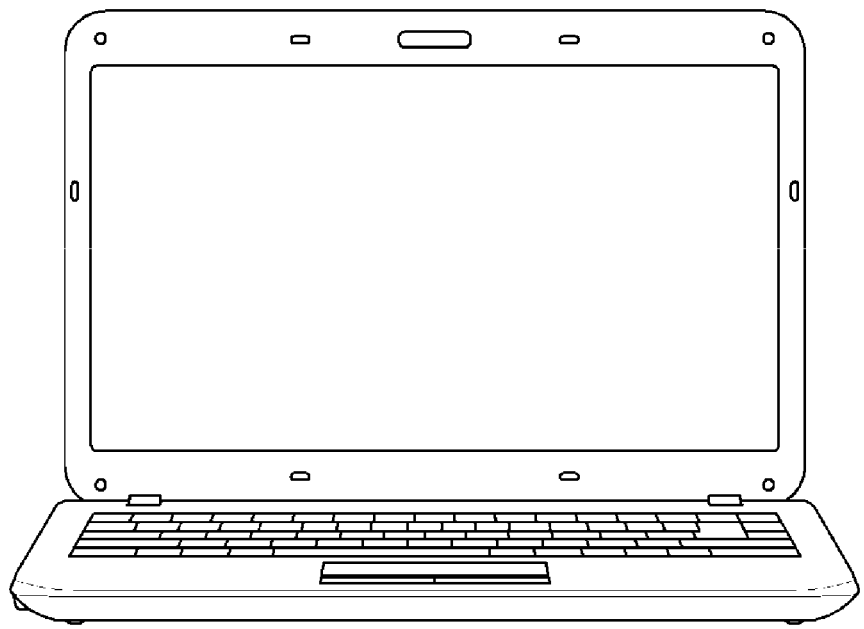
Figure 12:
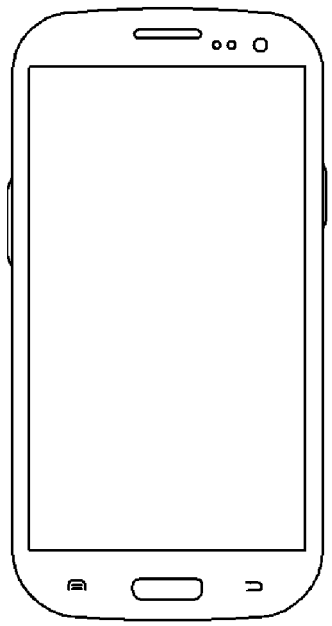

FIGS. 10 to 12 are example electronic systems to which the semiconductor device according to some example embodiments of the present inventive concepts can be applied.

FIG. 10 is a view illustrating a tablet PC 1200, FIG. 11 is a view illustrating a notebook 1300, and FIG. 12 illustrates a smart phone 1400. The semiconductor device 100 according to some example embodiments of the present inventive concepts can be used for the tablet PC 1200, the notebook 1300, the smart phone 1400 or the like.

Furthermore, it is apparent to those skilled in the art that the semiconductor device 100 according to some example embodiments of the present inventive concepts can also be applied to other integrated circuit devices that are not illustrated. That is, although only the tablet PC 1200, the notebook 1300, the smart phone 1400 and the like have been described above as an example of the electronic system according to the present example embodiment, the example of the electronic system according to the present example embodiment is not limited thereto. In some example embodiments of the present inventive concepts, the electronic system can be realized by a computer, a UMPC (Ultra Mobile PC), a workstation, a net-book, a PDA (Personal Digital Assistants), a portable computer, a wireless phone, a mobile phone, an e-book, a PMP (portable multimedia player), a portable game machine, a navigation device, a black box, a digital camera, a 3-dimensional television, a digital audio recorder, a digital audio player, a digital picture recorder, a digital picture player, a digital video recorder, a digital video player or the like.

While the present inventive concepts have been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present example embodiments be considered in all respects as illustrative and not restrictive, reference being made to the appended claims rather than the foregoing description to indicate the scope of the inventive concepts.

What is claimed is:

1. A semiconductor device comprising:
   a memory controller configured to generate a differential data strobe signal, and extend a length of a postamble section of the generated the differential data strobe signal from a first length to a second length; and
   the differential data strobe signal being configured to shift to a high impedance state after the postamble section,
   a memory provided with the differential data strobe signal having the postamble section extended to the second length, and synchronizes data using the provided differential data strobe signal,
   wherein the memory controller includes
   a data transfer circuit configured to provide the data for the memory, and wherein the memory includes
   a first buffer configured to convert the differential data strobe signal provided from the memory controller into an internal data strobe signal,
   a second buffer configured to convert the data provided from the memory controller into a CMOS level,
   a first data converter configured to convert the data, which has been converted into the CMOS level, into a first parallel data in synchronization with the internal data strobe signal,
   a second data converter configured to convert the first parallel data into a second parallel data in synchronization with the internal data strobe signal,
   a domain checker configured to check a phase between the internal data strobe signal and an internal clock signal, and
   a third data converter configured to convert the second parallel data into a third parallel data in synchronization with the internal data strobe signal in which the phase is checked.

2. The semiconductor device according to claim 1, wherein the differential data strobe signals are complementary in phase.

3. The semiconductor device according to claim 2, wherein the first data strobe signal is a signal in the form of consecutive pulses, and
   the second length is greater than a half cycle of each of the consecutive pulses.

4. The semiconductor device according to claim 3, wherein the first data strobe signal keeps a logic level during the second length.

5. The semiconductor device according to claim 3, wherein the first data strobe signal is shifted from a first level to a second level different from the first level during the second length.

6. The semiconductor device according to claim 3, wherein the second length is n times each cycle of the consecutive pulses (n is an integer of 1 or more).

7. The semiconductor device according to claim 6, wherein the first data strobe signal includes pulses that are repeated n times during the second length.

8. The semiconductor device according to claim 2, wherein the first data strobe signal is a signal in the form of consecutive pulses, and
   the first length is a half cycle of each of the consecutive pulses.

9. A semiconductor device comprising:
   a memory controller configured to generate a differential data strobe signal; and
   a converter configured to convert a postamble section of the differential data strobe signal to have an edge,
   wherein the differential data strobe signal includes pulses that are consecutively repeated between a preamble section and the postamble section, and
   a length of the postamble section converted by the converter is longer than a half cycle of the pulses;
   the memory controller is configured to provide the data for a memory; wherein the memory controller includes
   a signal generator configured to generate the differential data strobe signal,
   a converter configured to extend a length of the postamble section of the differential data strobe signal from the first length to the second length, and
   a data transfer circuit configured to provide the data for the memory, and wherein the memory includes
   a first buffer configured to convert the differential data strobe signal provided from the memory controller into an internal data strobe signal,
   a second buffer configured to convert the data provided from the memory controller into a CMOS level, a first data converter configured to convert the data, which has been converted into the CMOS level, into a first parallel data in synchronization with the internal data strobe signal, a second data converter configured to convert the first parallel data into a second parallel data in synchronization with the internal data strobe signal, a domain checker configured to check a phase between the internal data strobe signal and an internal clock signal, and a third data converter configured to convert the second parallel data into a third parallel data in synchronization with the internal data strobe signal in which the phase is checked.

10. The semiconductor device according to claim 9, wherein the preamble section precedes postamble section, and the differential data strobe signal stays at a high impedance state before the preamble section begins.

11. The semiconductor device according to claim 10, wherein the differential data strobe signal stays at the high impedance state after the postamble section ends.

12. The semiconductor device according to claim 9, wherein the edge includes a rising edge or a falling edge.

13. The semiconductor device according to claim 9, wherein the differential data strobe signal is shifted from a first level to a second level different to the first level, and forms the edge in the postamble section.

14. The semiconductor device according to claim 9, wherein the edge includes:

a first and a second rising edge, and a falling edge located between the first and second rising edges.

15. The semiconductor device according to claim 14, wherein the differential data strobe signal is shifted from a first level to a second level different from the first level, and forms the first rising edge, the differential data strobe signal is shifted from the second level to the first level, and forms the falling edge, and the differential data strobe signal is shifted from the first level to the second level, and forms the second rising edge.

16. The semiconductor device according to claim 14, wherein an interval between the first rising edge and the second rising edge is equal to a cycle of the pulses.

17. A semiconductor system comprising:

a memory controller configured to generate a differential data strobe signal, and extends a length of a postamble section of the generated differential data strobe signal from a first length to a second length; and a memory provided with the differential data strobe signal having the postamble section extended to the second length, and synchronizes data using the provided differential data strobe signal, and the memory controller is configured to provide the data for the memory; wherein the memory controller includes a signal generator configured to generate the differential data strobe signal, a converter configured to extend a length of the postamble section of the differential data strobe signal from the first length to the second length, and a data transfer circuit configured to provide the data for the memory, and wherein the memory includes a first buffer configured to convert the differential data strobe signal provided from the memory controller into an internal data strobe signal, a second buffer configured to convert the data provided from the memory controller into a CMOS level, a first data converter configured to convert the data, which has been converted into the CMOS level, into a first parallel data in synchronization with the internal data strobe signal, a second data converter configured to convert the first parallel data into a second parallel data in synchronization with the internal data strobe signal, a domain checker configured to check a phase between the internal data strobe signal and an internal clock signal, and a third data converter configured to convert the second parallel data into a third parallel data in synchronization with the internal data strobe signal in which the phase is checked.

18. The semiconductor system according to claim 17, wherein the memory controller is configured to provide the memory with the data in the form of a TTL (Transistor Transistor Logic) signal.

* * * * *